(12) United States Patent
Yang

(10) Patent No.: US 6,847,557 B2
(45) Date of Patent: Jan. 25, 2005

(54) METHOD OF ERASING NON-VOLATILE MEMORY DATA

(75) Inventor: Shih-Hsien Yang, Tao-Yuan (TW)

(73) Assignee: Winbond Electronics Corp., Hsinchu (TW)

( * ) Notice: Subject to any disclaimer, the term of this patent is extended or adjusted under 35 U.S.C. 154(b) by 80 days.

(21) Appl. No.: 10/248,499

(22) Filed: Jan. 24, 2003

(65) Prior Publication Data

US 2004/0145951 A1 Jul. 29, 2004

(51) Int. Cl.[7] .............................................. G11C 16/04
(52) U.S. Cl. .............................. 365/185.29; 365/185.3; 365/185.01
(58) Field of Search ........................ 365/185.29, 185.3, 365/185.01

(56) References Cited

U.S. PATENT DOCUMENTS

| | | | | |
|---|---|---|---|---|
| 5,576,992 A | * | 11/1996 | Mehrad | 365/185.24 |
| 5,856,945 A | * | 1/1999 | Lee et al. | 365/185.3 |
| 5,940,325 A | * | 8/1999 | Chang et al. | 365/185.28 |
| 6,504,765 B1 | * | 1/2003 | Joo | 365/185.29 |

* cited by examiner

Primary Examiner—Connie C. Yoha
(74) Attorney, Agent, or Firm—Jianq Chyun IP Office

(57) ABSTRACT

A method of erasing non-volatile memory data. The erasing method includes applying a first voltage to a substrate, applying a second voltage to a control gate and setting both source terminal and drain terminal to a floating state during a first time interval so that F-N tunneling can be utilized to carry out an erasing operation. In a second time interval, the control gate voltage is changed from the first voltage applied to a third voltage. In a third time interval, the substrate voltage is changed from the second voltage to 0 volt to prevent over-erasure of the non-volatile memory. The second voltage and the first voltage are in reverse bias. Similarly, the third voltage and the first voltage are also in reverse bias.

12 Claims, 5 Drawing Sheets

METHOD OF ERASING NON-VOLATILE MEMORY DATA

BACKGROUND OF INVENTION

1. Field of Invention

The present invention relates to a non-volatile memory device. More particularly, the present invention relates to a method of erasing non-volatile memory data.

2. Description of Related Art

Flash memory is a type of memory that retains data even after power to the memory is cut off. Furthermore, data can be transferred into, read out or erased from a flash memory device multiples of times. Due to all these advantages, flash memory has become one of the most widely adopted non-volatile memories inside personal computers and electronic equipment.

A typical flash memory device has a floating gate and a control gate fabricated using doped polysilicon. The control gate is positioned directly on top of the floating gate but are separated from each other by a dielectric layer. The floating gate is separated from an underlying substrate by a tunnel oxide layer (in the so-called stacked gate flash memory).

To write data into the flash memory, a bias voltage is applied to the control gate and the source/drain regions such that electrons are injected into the floating gate.

On the other had, to read data from the flash memory, a working voltage is applied to the control gate so that the charging state of the floating gate determines the opening or closing of the channel underneath. According to the opening or closing of the channel, a read-out value of "1" or "0" is registered. To erase data from the flash memory, relative potential between the substrate, the drain (source) region or control gate is raised. Through the tunneling effect, electrons penetrates through the tunnel oxide layer into the substrate or drain (source) terminal (the substrate erase or drain (source) side erase) or penetrates through the dielectric layer into the control gate.

Flash memory generally uses channel hot-electron (CHE) injection mode to carry out programming and uses Fowler-Nordheim (F-N) tunneling mode to erase by freeing the trapped electrons inside the floating gate to the channel through the tunnel oxide layer.

However, when the F-N tunneling mode is used to erase data from the flash memory, the quantity of electrons expelled from the floating gate is hard to control. The floating gate may be positively charged if too many electrons are expelled from the floating gate. This phenomenon is often called over-erase. When over-erase occurs, there will be a wider distribution of threshold voltage and an increase in bit line leakage current. Furthermore, if over-erase is really serious, the channel layer underneath the control gate may conduct even without the application of any working voltage leading to data read-out error. To minimize the effect due to over-erasure, extra software programming and over-erase repair must be carried out. However, this will lead to an increase in erasing time as well as an expansion of circuit regions.

SUMMARY OF INVENTION

Accordingly, one object of the present invention is to provide a method of erasing non-volatile memory data capable of preventing an over-erasure of memory cells and Increase the operating speed and reliability of the memory device.

To achieve these and other advantages and in accordance with the purpose of the invention, as embodied and broadly described herein, the invention provides a method of erasing non-volatile memory data. The non-volatile memory at least includes a control gate, a substrate, a source and a drain region. The erasing method includes applying a first voltage to the substrate and applying a second voltage to the control gate in a first time interval so that both the source region and the drain region are floating, thereby triggering channel F-N tunneling to erase the data. Thereafter, in a second time interval, the first voltage applied to the control gate is changed to a third voltage. In a third time interval, the second voltage applied to the substrate is changed to a 0 volt to prevent over-erasing the non-volatile memory. The second voltage and the first voltage are in reverse bias. Similarly, the third voltage and the first voltage are in reverse bias.

Within the second time interval, the step of changing the control gate voltage from the first voltage to the third voltage includes changing the control gate voltage from 0 volt to the third voltage after changing the control gate voltage from the first voltage to 0 volt. Furthermore, in the third time interval, the step of changing substrate voltage from the second voltage to 0 volt to prevent the over-erasure includes changing the fourth voltage applied to the control gate to 0 volt after changing the control gate voltage from the second voltage to the fourth voltage. The value of the fourth voltage is between the second voltage and a zero volt.

To erase data from the non-volatile memory according to this Invention, a negative bias voltage is applied to the control gate, both the source terminal and the drain terminal are set to a floating state and a positive bias voltage is applied to the substrate (P-well region) so that F-N tunneling effect can be utilized to carry out the erasing operation. After changing the bias voltage of the control gate from a negative bias to a positive bias, bias voltage of the substrate (P-well region) is changed from a positive bias to 0 volt. Hence, the source/drain junction in a floating state is immediately bias to a large inversion bias voltage region and electron/hole pairs are produced at the junction due to a strong electric field. When a positive bias is applied to the control gate, strength of vertical electric field is increased such that electrons injects through the tunnel oxide layer into the floating gate. If the non-volatile memory reaches a high over-erase potential, the quantity of injected electrons will increase accordingly. Under the condition that the quantity of electrons (during erase) moving out of the floating gate is the same as the quantity of electrons injected into the floating gate, a self-converging mechanism will operate to suppress the degree of over-erasure. Thereafter, a negative bias is again applied to the control gate, the source and drain terminals are again set to a floating state and a positive bias is again applied to the substrate so that the F-N tunneling effect is utilized to carry out the erasure. Similarly, after changing the bias voltage of the control gate from a negative bias to a positive bias, bias voltage of the substrate is again changed from a positive bias to 0 volt. This completes the process of erasing data from the non-volatile memory.

The non-volatile memory data erasing method according to this invention is able to cut down the time needed to carry out verification and repair, thereby reducing average erasure period.

The erasing method of this invention also eliminates the need for special over-erase verification and repair circuits, thereby increasing overall level of device integration.

In addition, although the erasing method according to this invention is divided into a few sessions, these sessions are implemented in a single step in practice. In other words, the bias voltage applied to the control gate and the substrate (the P-well region) can be regarded as an erase bias voltage. Thus, memory over-erase condition is suppressed and the spread of the erase threshold voltage is reduced through a single bias voltage without carrying extra steps for over-erase verification.

In this invention, the source/drain junction bias voltage is increased to a value greater than the cumulative breakdown voltage during the third time interval. In practice, however, this will not lead to a breakdown of the source/drain junction. Furthermore, the switching of the second voltage applied to the substrate to 0 volt during the third time interval is carried out in two stages. This prevents the breakdown of the source/drain junction due to the creation of a large transient reverse electric field when the voltage differential in the substrate transiting from a positive bias voltage to 0 volt is too large. Hence, this invention is able to prevent source/drain junction breakdown and increase overall reliability of the device.

Moreover, the non-volatile memory erasing method may be applied to both n-channel non-volatile memory and p-channel non-volatile memory.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
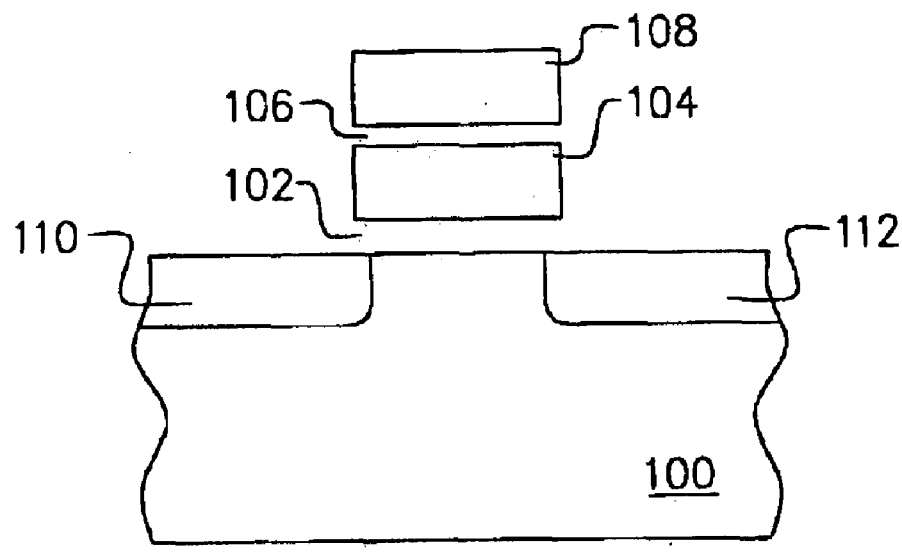
FIG. 1 is a schematic cross-section view of one type of a non-volatile memory.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-section view of one type of a non-volatile memory. As shown in FIG. 1, a non-volatile memory device basically includes a substrate 100, a tunnel oxide layer 102, a floating gate 104, a gate dielectric layer 106, a control gate 108, a source region 110 and a drain region 112.

The substrate 100 having a well region therein is a silicon substrate, for example. The control gate 108 is positioned above the substrate 100 and fabricated using doped polysilicon, for example. The floating gate 104 is located between the control gate 108 and the substrate 100 and fabricated using doped polysilicon, for example. The gate dielectric layer 106 is located between the control gate 108 and the floating gate 104. The gate dielectric layer 106 can be a composite layer comprising of a silicon oxide layer, a silicon nitride layer and a silicon oxide layer. Alternatively, the gate dielectric layer 106 can be a composite layer comprising of a silicon oxide layer and a silicon nitride layer or just a silicon oxide layer. The tunnel oxide layer 102 is setup between the floating gate 104 and the substrate 100 and fabricated using silicon oxide. The source region 110 and the drain region 112 are setup in the substrate 100 on each side of the floating gate 104.

Figure 2A:
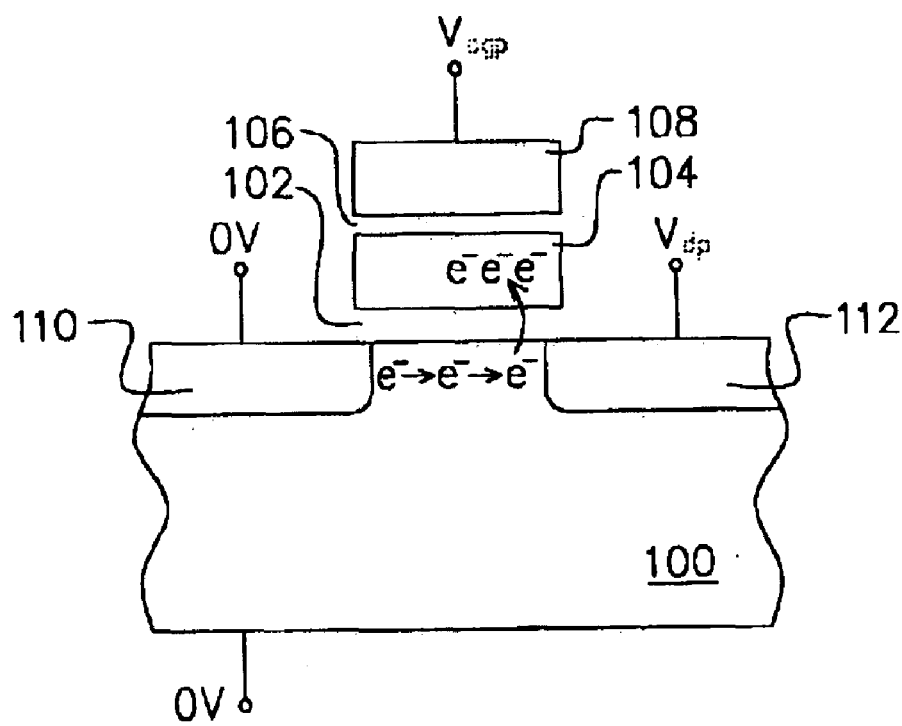
FIGS. 2A to 2C are schematic cross-sectional views showing various operating modes of the non-volatile memory according to one preferred embodiment of this invention.
Figure 2B:
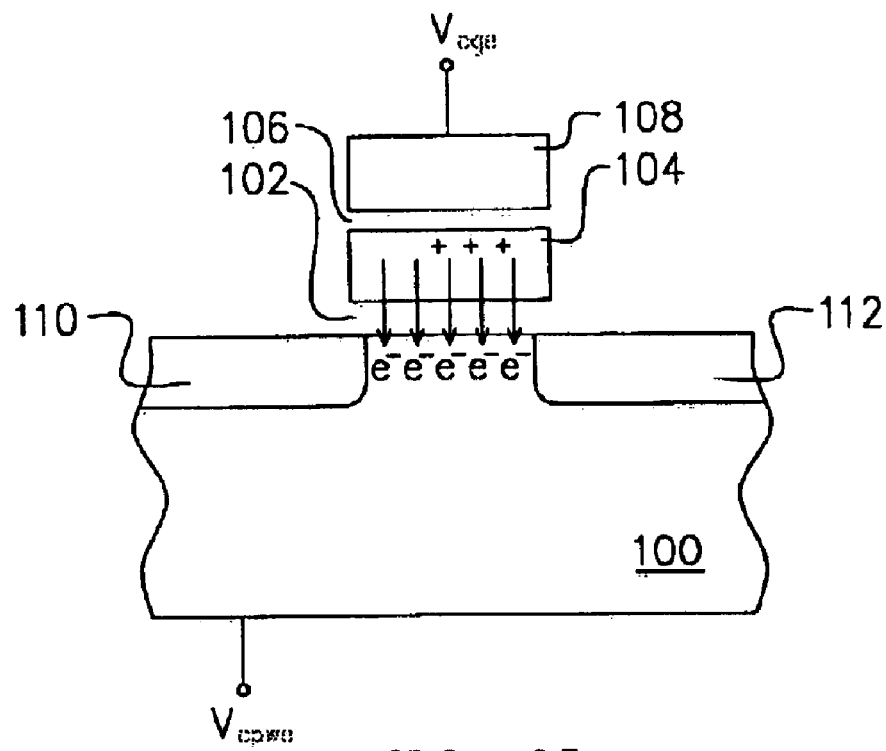
Figure 2C:
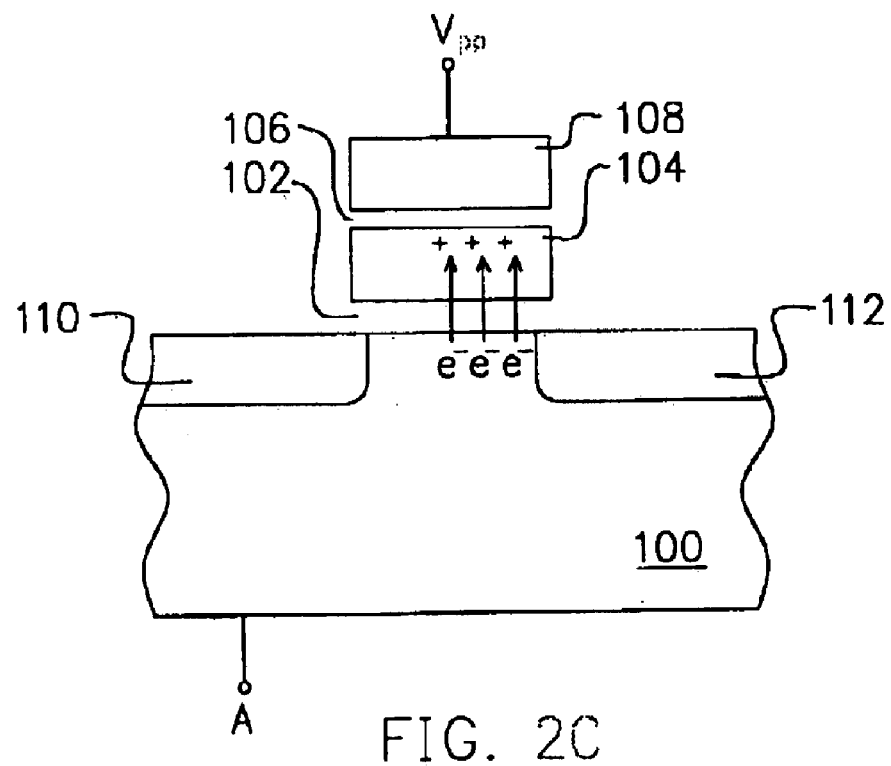

FIGS. 2A to 2C are schematic cross-sectional views showing various operating modes of the non-volatile memory according to one preferred embodiment of this invention. FIG. 2A indicates the programming mode and FIGS. 2B and 2C indicate the erasing mode of operation. In this embodiment, channel hot electron (CHE) injection effect is used in a programming operation while erasing is carried out using the erasing method according to this invention. Components in FIGS. 2A to 2C identical to the ones in FIG. 1 are labeled with an identical number.

To program a memory cell, a bias voltage Vcgp of between 9V to 12V is applied to the control gate 108 and a bias voltage Vdp of between 5V to 7V is applied to the drain terminal 112 so that the voltage at both the source terminal 110 and the substrate 100 (the p-well region) is about 0V. Under the voltage bias condition, a large channel current (0.25 mA/memory cell to 1 mA/memory cell) flows. Electrons move from the source terminal 110 to the drain terminal 112 and accelerate by the high electric field near the drain terminal 112 to generate hot electrons. In the presence of a high positive bias voltage at the control gate 108, the hot electrons at the drain terminal 112 have sufficient kinetic energy to penetrate through the energy barrier provided by the tunnel oxide layer 102 into the floating gate 104 as shown in FIG. 2A. After the programming operation, negative charges are trapped inside the floating gate leading to a rise in the threshold voltage ($V_T$) of the memory cell. The trapped charges will remain inside the floating gate 104 for a long period of time (for example, may station inside the floating gate for ten years at room temperature) unless they are purposely released.

Figure 3:
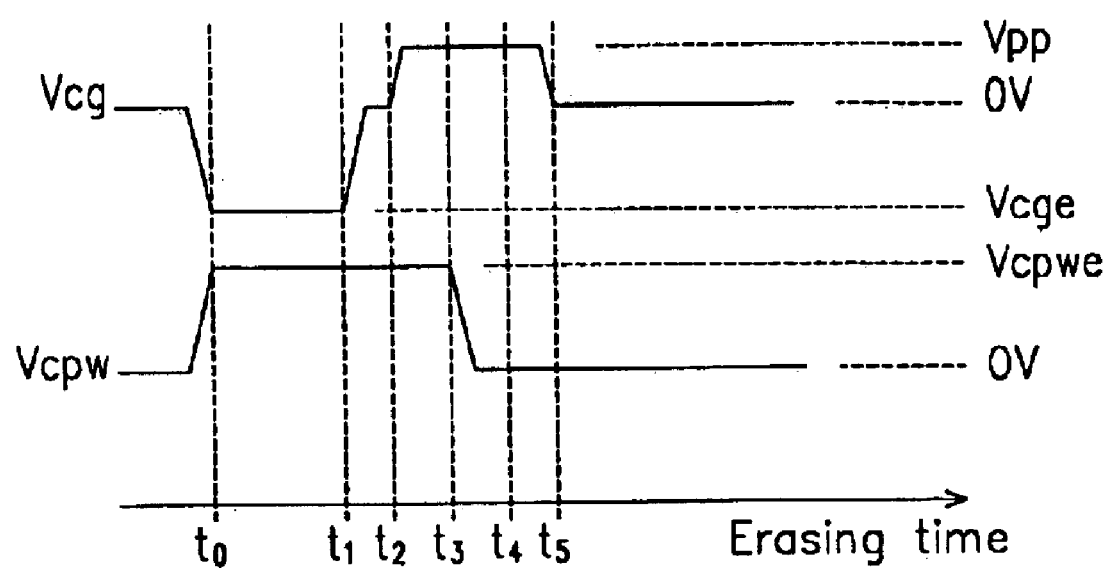
FIG. 3 is a timing diagram of the variation of operating voltage in carrying out the non-volatile memory erasing method according to one preferred embodiment of this invention.

FIG. 3 is a timing diagram of the variation of operating voltage in carrying out the non-volatile memory erasing method according to one preferred embodiment of this invention. The process of erasing non-volatile memory data can be explained with reference to a few time intervals. In practice, however, the erasing method according to this invention is applied in a single step. To erase data from a memory cell, a negative bias voltage Vcge of about 9V to 15V is applied to the control gate 108 and a positive bias voltage Vcpwe of between 5V to 10V is applied to the substrate 100 (the p-well region) while the drain terminal 112 and the source terminal 110 remain in a floating state in the time interval between t0 to t1. Hence, a large voltage difference between the control gate 108 and the substrate 100 (the p-well region) is provided to establish a large electric field. Through F-N tunneling effect, electrons are pulled out from the floating gate 106 into the channel as shown in FIG. 2B. During the time interval t0 to t1, the quantity of electrons pulled out from the floating gate 104 is difficult to control. Since too many electrons may be pulled away from the floating gate 104, positive charges may accumulate inside the floating gate 104 leading to the so-called over-erase phenomenon.

In the time interval between t1 to t3, a positive bias voltage Vpp of between 0.1 to 5V is applied to the control gate 108 and a positive bias voltage Vcpwe of between 5V to 10V is maintained at the substrate 100 (the p-well region) while the drain terminal 112 and the source terminal 110 remain in a floating state. During this time interval, the negative bias voltage applied to the control gate is switched to a positive bias voltage. Due to the large voltage difference between the negative bias voltage Vcge and the positive bias voltage Vpp applied to the control gate 108, a two-stage switching may be deployed. For example, the negative bias voltage at the control gate 108 is changed to 0V in the time interval t1 to t2 and then changed to the positive bias voltage Vpp in the time interval t2 to t3.

After the negative bias voltage applied to the control gate 108 is changed to the positive bias voltage, the positive bias voltage Vpp of between 0.1V to 5V at the control gate 108 is maintained and the bias voltage at the substrate 100 (the p-well region) is changed to 0V while the drain terminal 112 and the source terminal 110 remains in a floating state in the time interval between t3 to t4. As the substrate 100 changes from a positive bias voltage to 0V during this interval, the floating source terminal 110 and drain terminal 112 junction will be biased into a large reverse bias region so that electron-hole pairs are created by the junction electric field. Therefore, the positive bias voltage applied to the control gate 108 will create a vertical electric field that permits the injection of electrons through the tunnel oxide layer 102 into the floating gate 104 as shown in FIG. 2C. The quantity of electrons injected into the floating gate 104 depends on the electric potential. If the non-volatile memory has a high over-erase potential, the number of electrons injected into the floating gate 104 will increase accordingly. A self-converging mechanism will kick in when the quantity of electrons moving out of the floating gate 104 almost balances the quantity of electrons injected into the floating gate 104, thereby suppressing any over-erase condition.

Figure 4A:
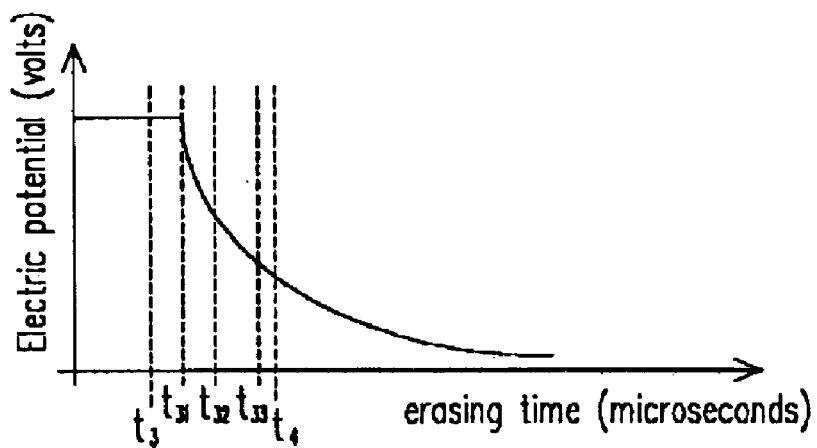
FIGS. 4A to 4C are timing diagrams of the variation of source/drain terminal potential, the variation of memory cell well region potential and the variation of source/drain junction bias voltage respectively.
Figure 4B:
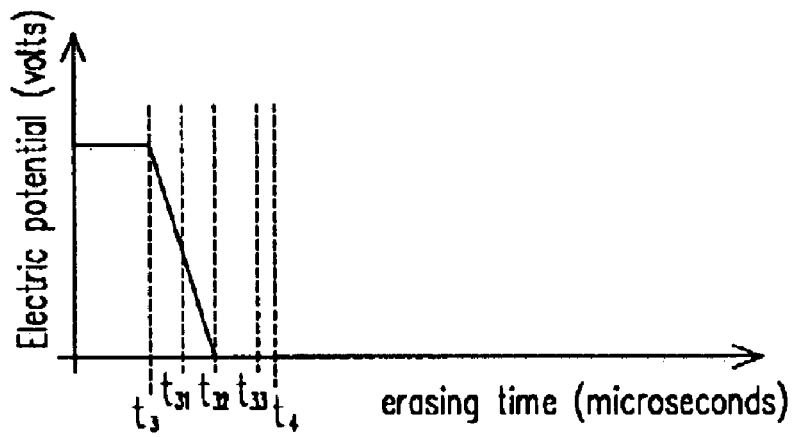
Figure 4C:
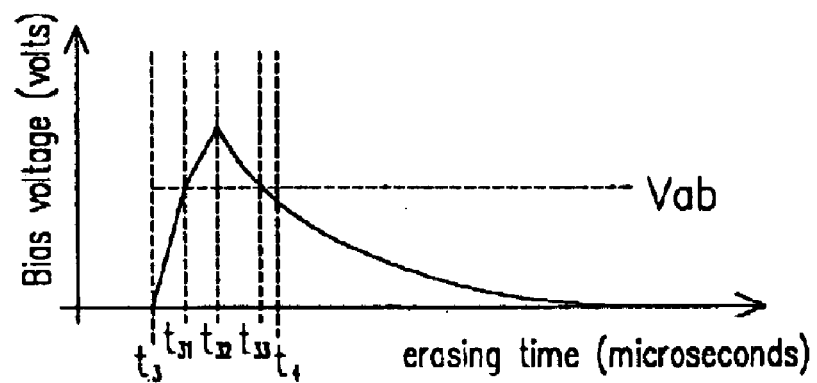

FIGS. 4A to 4C are timing diagrams of the variation of source/drain terminal potential, the variation of memory cell well region potential and the variation of source/drain junction bias voltage during the time interval t3 to t4 respectively. As shown in FIGS. 4A to 4C, the source/drain potential, the p-well region potential and the source/drain junction bias voltage remain at a constant value before time t3. During the period from t3 to t31, the source/drain potential remains at a constant value, the p-well region potential drops gradually and the source/drain bias voltage increases gradually. During the period from t31 to t32, the source/drain potential drops gradually, the p-type well region drops to 0V and the source/drain junction bias voltage increases to a threshold value. In addition, the source/drain junction bias voltage increases to a value greater than the cumulative breakdown voltage Vab. During the period from t32 to t33, the source/drain potential drops gradually, the p-well region potential remains at 0V and the source/drain junction bias voltage drops gradually. However, the source/drain junction bias voltage is still greater than the cumulative breakdown voltage Vab. During the period from t33 to t4, the source/drain potential drops gradually, the p-well region potential remains at 0V and the source/drain junction bias voltage drops gradually to a value smaller than the cumulative breakdown voltage Vab. In the aforementioned time period from t31 to t33, the source/drain junction bias voltage is greater than the cumulative breakdown voltage and hence electron-hole pairs will be produced. In the presence of a positive bias voltage at the control gate, vertical electric field will pull electrons through the tunnel oxide layer into the floating gate. Although the source/drain junction bias voltage during the time interval t31 to t33 is larger than the cumulative breakdown voltage, the source/drain junction will not break down in practice.

Furthermore, if the voltage difference when the substrate 100 (the p-well region) is switched from the positive bias voltage Vcpwe to 0V is large, a large inversion electric field may be created during the transient leading to a breakdown of the source/drain junction. Thus, a two-stage switching is deployed between the time interval t3 to t4 to prevent source/drain junction breakdown and increase device reliability.

As shown in FIG. 3, no voltage (0V) is applied to the control gate and the substrate 100 (p-well region) is maintained at 0V while the drain terminal 112 and the source terminal 110 remain in a floating state within the time interval t4 to t5. Thereafter, a negative bias voltage Vcge is again applied to the control gate 108 and a positive bias voltage Vcpwe is again applied to the substrate 100 (the p-well region) while the drain terminal 112 and the source terminal 110 remain in a floating state. After utilizing the F-N tunneling effect to carry out the erasing step and switching the control gate 108 from a negative bias voltage to a positive bias voltage, the positive bias voltage at the substrate 100 (the p-well region) is switched back to 0V. This completes the non-volatile memory erasing operation.

Figure 5:
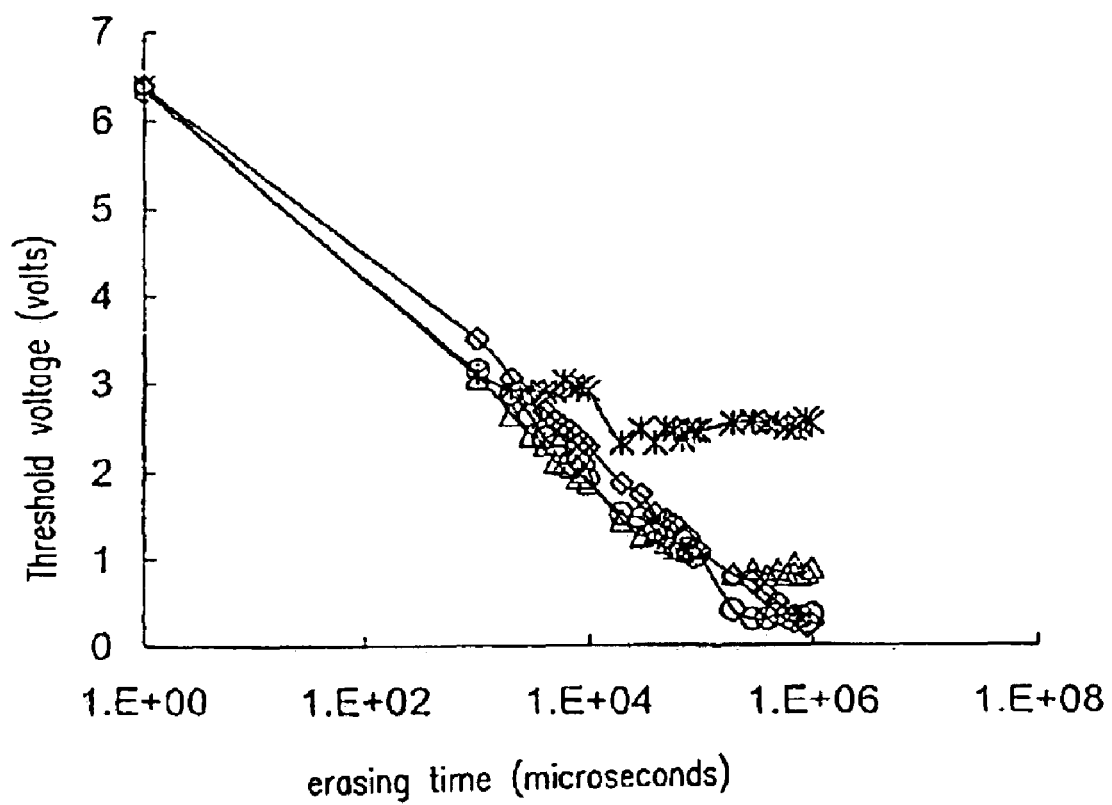
FIG. 5 is a graph showing the relationship between threshold voltage and erasing period at different bias voltage Vpp according to the erasing method of this invention.

FIG. 5 is a graph showing the relationship between threshold voltage and erasing period at different bias voltage Vpp according to the erasing method of this invention. In FIG. 5, the symbol ◇ indicates the conventional technique, the symbol o indicates the voltage Vpp is at 2V, the symbol Δ indicates the voltage Vpp is at 3V and the symbol * indicates the voltage Vpp is at 5V. In FIG. 5, threshold voltage of the symbol ◇ drops as the erasing time is increased indicating that the emergence of over-erase condition. On the other hand, the threshold voltage of the symbols o, the symbol Δ and the symbol * drops as the erasing time is increased initially and then maintained at a constant value thereafter. Moreover, as the applied bias voltage Vpp is increased, the post-erase threshold voltage will increase. In other words, using the non-volatile memory erasing method according to this invention can actually prevent over-erase phenomenon from occurring.

To erase data from the non-volatile memory according to the aforementioned embodiment, a negative bias voltage Vcge is applied to the control gate, both the source terminal and the drain terminal are set to a floating state and a positive bias voltage Vcpwe is applied to the substrate (P-well region) so that F-N tunneling effect can be utilized to carry out the erasing operation. After changing the bias voltage of the control gate from a negative bias to a positive bias, bias voltage of the substrate (P-well region) is changed from a positive bias to 0 volt. Hence, the source/drain junction in a floating state is immediately bias to a large inversion bias voltage region and electron/hole pairs are produced at the junction due to a strong electric field. When a positive bias is applied to the control gate, strength of vertical electric field is increased such that electrons injects through the tunnel oxide layer into the floating gate. If the non-volatile memory reaches a high over-erase potential, the quantity of injected electrons will increase accordingly. Under the condition that the quantity of electrons (during erase) moving out of the floating gate is the same as the quantity of electrons injected into the floating gate, a self-converging mechanism will operate to suppress the degree of over-erasure. Hence, the non-volatile memory data erasing method according to this invention is able to cut down the time needed to carry out verification and repair, thereby reducing average erasure period. In addition, the erasing method of this invention also eliminates the need for special over-erase verification and repair circuits, thereby increasing overall level of device integration.

Although the erasing method according to this invention is divided into a few sessions, these sessions are implemented in a single step in practice. In other words, the bias voltage applied to the control gate and the substrate (the P-well region) can be regarded as an erase bias voltage. Thus, memory over-erase condition is suppressed and the spread of the erase threshold voltage is reduced through a single bias voltage without carrying extra steps for over-erase verification.

In the aforementioned description, the erasing method of this invention is applied to an n-channel non-volatile memory. However, the erasing method is equally applicable to a p-channel non-volatile memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of erasing non-volatile memory data, wherein the non-volatile memory at least includes a control gate, a substrate, a source region and a drain region, the method comprising the steps of:

applying a first voltage to the substrate, applying a second voltage to the control gate and setting both the source and the drain region to a floating state in a first time interval so that Fowler-Nordheim tunneling is utilized to carry out the erasing operation;

changing the first voltage applied to the control gate to a third voltage in a second time interval; and changing the second voltage applied to the substrate to 0 volt in a third time interval to prevent over-erasure of the non-volatile memory;

wherein the second voltage and the first voltage are in reverse bias and the third voltage and the first voltage are in reverse bias.

2. The erasing method of claim 1, wherein the step of changing the control gate voltage from the first voltage to the third voltage during the second time interval includes changing the control gate voltage from 0 volt to the third voltage after changing the control gate voltage from the first voltage to 0 volt.

3. The erasing method of claim 1, wherein the step of changing the substrate voltage from the second voltage to 0 volt to prevent over-erasure includes changing the control gate voltage from the fourth voltage to 0 volt after changing the control gate voltage from the second voltage to a fourth voltage such that the fourth voltage has a value intermediate between the second voltage and 0 volt.

4. The erasing method of claim 1, wherein the first voltage is between 9V to 15V.

5. The erasing method of claim 1, wherein the second voltage is between 5V to 10V.

6. The erasing method of claim 1, wherein the third voltage is between 0.1V to 5V.

7. A method of erasing non-volatile memory data, wherein the non-volatile memory at least includes a control gate, a substrate, a source region and a drain region, the method comprising the steps of:

(a) applying a first voltage to the substrate, applying a second voltage to the control gate and setting both the source region and the drain region to a floating state and utilizing Fowler-Nordheim tunneling to carry out an erasing operation;

(b) changing the voltage applied to the control gate from the first voltage to a third voltage;

(c) changing the voltage applied to the substrate from the second voltage to 0 volt; and (d) repeating the steps from (a) to (c) until the erase threshold voltage of the non-volatile memory reaches a pre-defined value;

wherein the second voltage and the first voltage are in reverse bias and the third voltage and the first voltage is in reverse bias.

8. The erasing method of claim 7, wherein step (b) further includes the sub-steps of changing the control gate voltage from 0 volt to the third voltage after changing the control gate voltage from the first voltage to 0 volt.

9. The erasing method of claim 7, wherein step (c) further includes the sub-steps of changing the substrate voltage from the fourth voltage to 0 volt after changing the substrate voltage from the second voltage to a fourth voltage such that the fourth voltage has a value intermediate between the second voltage and 0 volt.

10. The erasing method of claim 7, wherein the first voltage is between 9V to 15V.

11. The erasing method of claim 7, wherein the second voltage is between 5V to 10V.

12. The erasing method of claim 7, wherein the third voltage is between 0.1V to 5V.

* * * * *